United States Patent [19]

Ziger et al.

[11] Patent Number: 5,780,208

[45] Date of Patent: Jul. 14, 1998

[54] METHOD AND MASK DESIGN TO MINIMIZE REFLECTIVE NOTCHING EFFECTS

[75] Inventors: David Ziger; Pierre Leroux, both of San Antonio, Tex.

[73] Assignee: VLSI Technology, Inc., San Jose, Calif.

[21] Appl. No.: 731,697

[22] Filed: Oct. 17, 1996

[51] Int. Cl.[6] .................................................. G03C 5/00
[52] U.S. Cl. ..................... 430/394; 430/396; 430/322; 430/494; 250/492.22
[58] Field of Search ........................ 430/296, 396, 430/494, 322, 394; 250/492.22, 492.3

[56] References Cited

U.S. PATENT DOCUMENTS

| | | | |
|---|---|---|---|
| 4,504,558 | 3/1985 | Bohlen et al. | 430/30 |
| 4,520,269 | 5/1985 | Jones | 250/492.2 |
| 5,086,398 | 2/1992 | Moriizumi | 364/490 |
| 5,097,138 | 3/1992 | Wakabayashi et al. | 250/492.2 |
| 5,424,173 | 6/1995 | Wakabayashi et al. | 430/296 |
| 5,503,951 | 4/1996 | Flanders et al. | 430/5 |
| 5,532,496 | 7/1996 | Gaston | 250/492.22 |

OTHER PUBLICATIONS

Proceedings, SPIE–The International Society for Optical Engineering, Optical/Laser Microlithography VII, 2–4 Mar. 1994, San Jose, CA, vol. 2197, pp. 140–149.

Proceedings, SPIE–The International Society for Optical Engineering, Optical/Laser Microlithography VIII, 22–24 Feb. 1995, Santa Clara, CA, vol. 2440, pp. 494–505.

*Primary Examiner*—George F. Lesmes
*Assistant Examiner*—Steven H. Ver Steeg
*Attorney, Agent, or Firm*—Flehr Hohbach Test Albritton & Herbert LLP

[57] ABSTRACT

A method is described for reducing light scatter in lithographically producing a resist feature wherein the dosage of light beyond the immediate periphery of the desired feature is subjected to a lower dosage of light than is required to properly define the edges of the resist feature. In addition, a mask is described which is partially opaque in those areas remote from the area delineating the desired feature.

6 Claims, 4 Drawing Sheets

METHOD AND MASK DESIGN TO MINIMIZE REFLECTIVE NOTCHING EFFECTS

The present invention relates generally to the process of creating resist features on a semiconductor wafer and, more particularly, to creating such features with a minimum of defects due to the scattering of light within the resist.

BACKGROUND OF THE INVENTION

The fabrication of integrated circuits requires numerous steps wherein each element or feature of the circuit is formed on an underlying substrate by lithographic means. In each lithographic step, a negative or positive photoresist is coated onto the substrate and then subjected to some form of electromagnetic radiation in a pattern defining the desired features. Various forms of radiation may be used, such as visible light, ultra-violet, e-beam, ion-beam or even x-ray. With the exception of x-rays, each of these forms of radiation has a tendency to scatter within the resist; although the problem is much reduced in the case ion-beams. The scattering increases with each additional lithographic step because each of these steps adds more and more uneven surface topography to the substrate. The topography itself acts as a reflector of the radiation. The effect is particularly pronounced when the topography, in plan view, is in the form of a concave arc, thereby concentrating the reflected radiation at focal points in areas intended to be free of radiation. The overall effect is to degrade the edges of the desired pattern and limit the minimum size of the features being formed. It is, therefore, a distinct advantage to eliminate as much of the scattering as possible.

When the radiation is visible light, ultraviolet, x-ray, or sometimes even e-beam, the radiation is directed onto the photoresist through a mask having opaque and transparent portions in the pattern of the desired features. If a negative resist is used, that is, one which is hardened and turned insoluble upon exposure to the radiation, the mask pattern will be such that the transparent portions are in the shape of the desired resist features. On the other hand if a positive resist is used, that is, one that is initially insoluble but turned soluble upon being subjected to the radiation, the opaque portions will be in the shape of the desired resist features. In either case the mask ordinarily comprises a glass plate having a pattern thereon including areas of opacity and transparency to the particular radiation being used.

BRIEF SUMMARY OF THE INVENTION

In accordance with the invention a mask is produced having three distinct tones of light transmissivity. The first tone has a nominally zero transmission of radiation for the desired resist features (for a positive photo-resist). In addition, there is the usual nominally one hundred percent (100%) transmission. However, the one hundred percent transmission is limited to a border immediately surrounding the desired resist features. The remainder of the mask has a transmission somewhat less than one hundred percent (100%) for the larger open areas. The larger open areas are thus exposed to a smaller dose of radiation than is required to define resist features edges. The smaller dosage impinging on the topographic features reduces the magnitude of scattering. This is possible because large open areas of resist can be developed at a radiation dose that is substantially less than the radiation dose required to define resist feature edges. As an example, with current fabrication in a 0.35 µm poly process, a dose of 1280 J/m² is required to define the edges of each resist feature. In the larger, more open areas of the wafer, a dose of merely of 960 J/m², that is, seventy-five percent (75%) of the dose required to define the resist feature, is sufficient. In accordance with the invention a three tone mask has been prepared for a lithographic process with these parameters. The mask is characterized by a) nominally zero transmission in regions defining the resist features themselves; b) a border of about 0.2 µm surrounding each of the resist features and having nominally one hundred percent (100%) transmission; and c) seventy-five percent (75%) transmission over the remainder of the mask.

It has been found that in providing such a mask, reflective notching has been substantially reduced. As another benefit, such a mask design reduces the flare caused by lens scattering. Since the radiation dosage is reduced over most of the mask, scattering is similarly reduced.

BRIEF DESCRIPTION OF THE DRAWING

Additional objects and features of the invention will be more readily apparent from the following detailed description and the appended claims when taken in conjunction with the drawings, in which:

DESCRIPTION OF THE PREFERRED EMBODIMENTS

Figure 1:
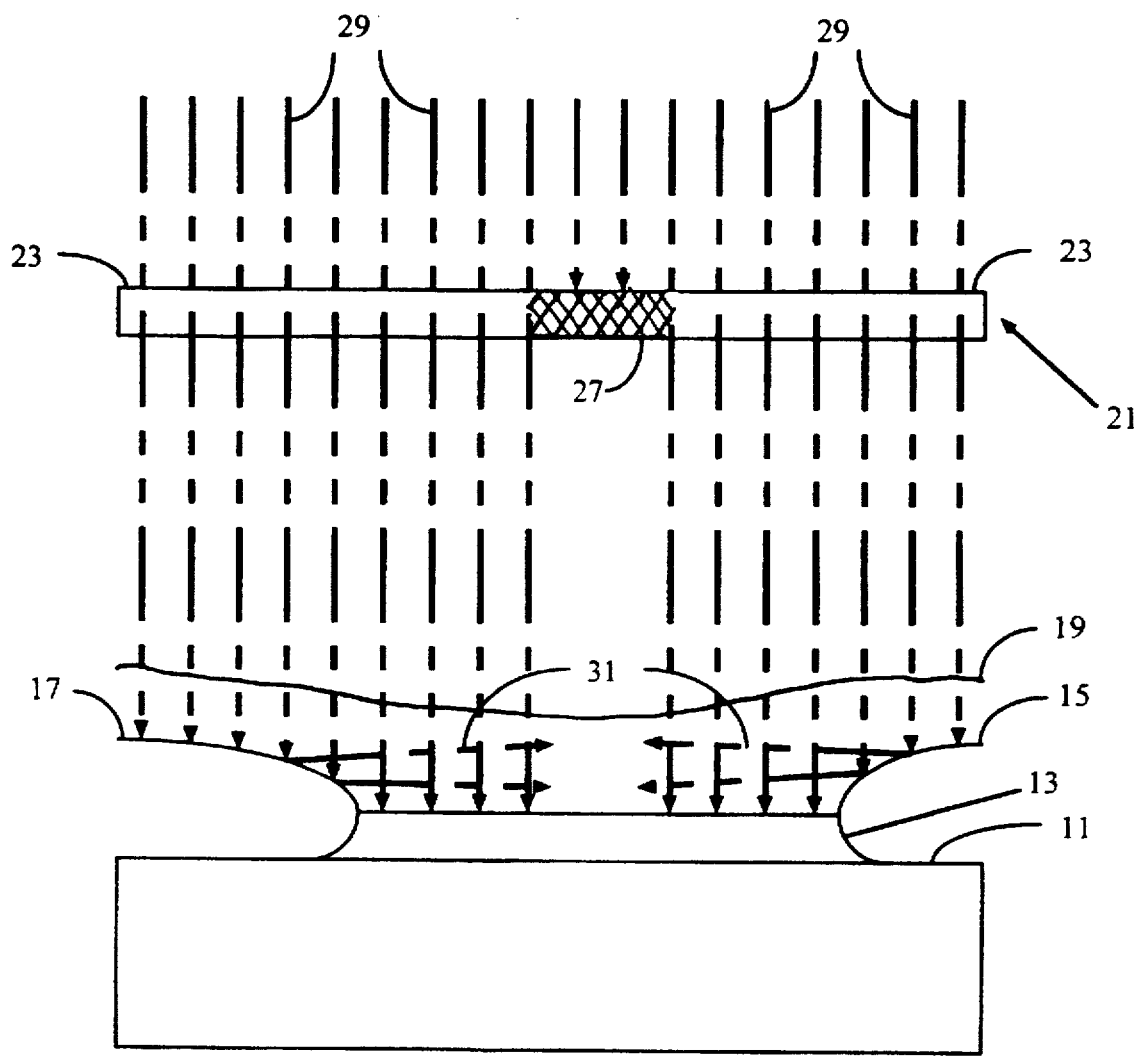
FIG. 1 is an elevational cross-section, in schematic form, showing a mask of the prior art and the manner in which underlying topography scatters the incoming radiation and degrades the intended edges of the desired pattern.

Referring to FIG. 1, there is schematically shown a substrate 11 having a previously formed gate element 13 disposed thereon as well as additional previously formed topography 15 and 17. A layer of positive photoresist 19 overlies all the topography 13, 15 and 17. In addition, there is shown a mask 21, well know in the prior art, including transparent areas 23 as well as an opaque area 27.

In accordance with the prior art, electromagnetic radiation in the form of light, diagrammatically shown by the arrows 29, is projected onto the photoresist 19 through the mask 21. Optimally, all the light 29 which passes directly through the photoresist 19 will leave a shadow in the precise shape of the opaque area 27 of the mask. However, as the light passes through the photoresist 19 and strikes the curved topographies 15 and 17, it is reflected toward the shadow area as shown by the arrows 31. Of course, the positive resist in the shadow area is affected by the reflected light and becomes partly soluble at the extremity of the shadow. The result is that when the photoresist is subsequently subjected to a solvent, a portion of the ideal shadowed area is washed away and the overall effect is to produce a resist element quite noticeably smaller than the ideal.

Figure 2:
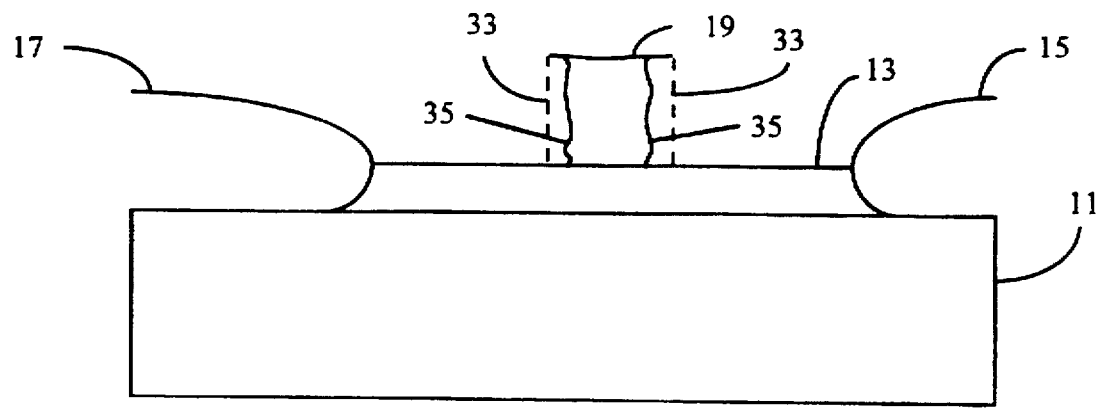
FIG. 2 is a view similar to FIG. 1, but showing the resultant feature in solid lines and the ideal feature in dashed lines.

The difference between the ideal and the actual resist element is shown in FIG. 2. The ideal sidewalls of the photoresist 19 are shown in dashed lines as at 33. However, due to the reflected light, the actual sidewalls of the resist appear as shown at 35 resulting in a considerably smaller resist element.

Figure 3:
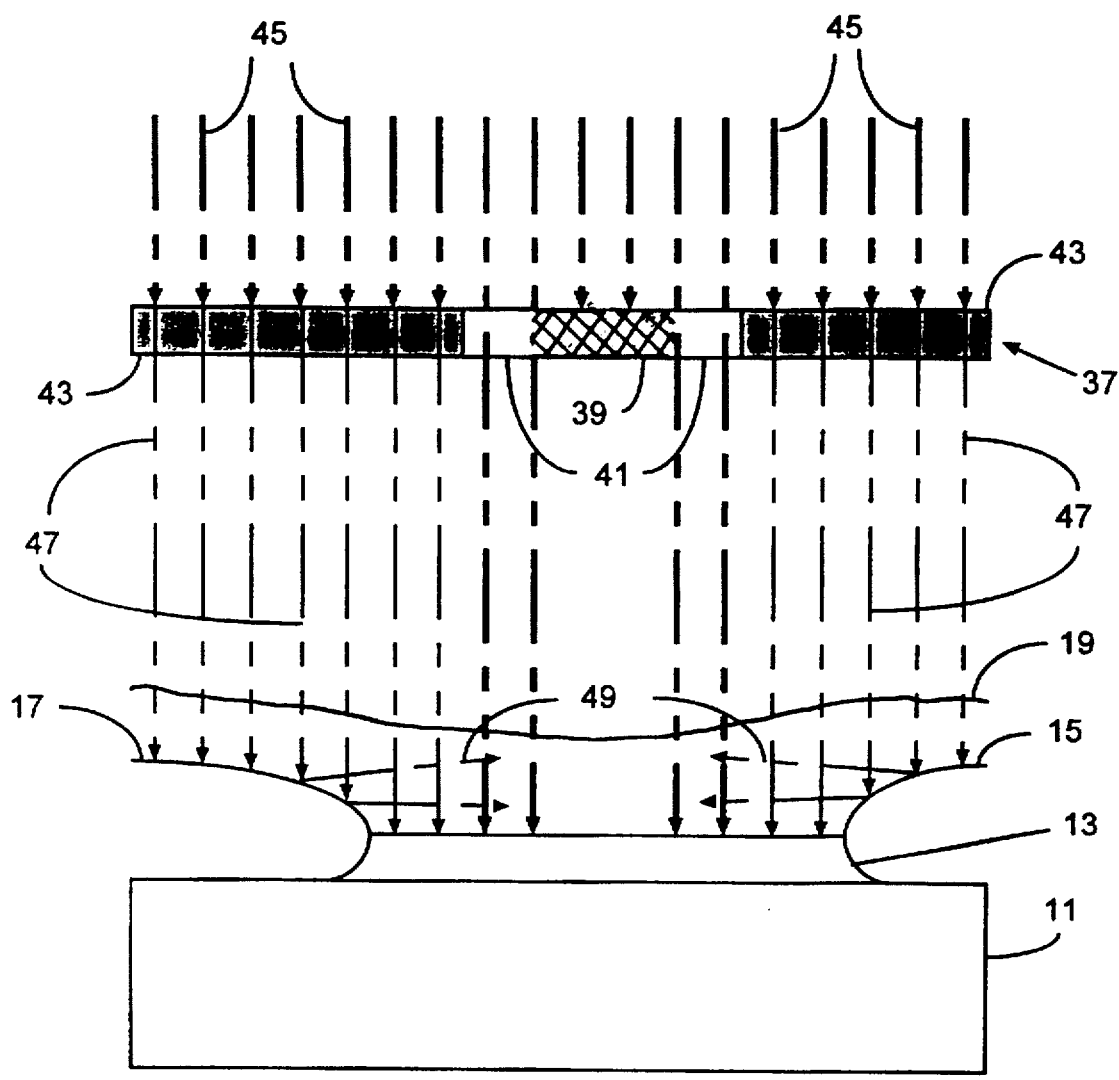
FIG. 3 is a view similar to FIG. 1, but showing a mask in accordance with the invention and the resulting reduction of the undesirable scatter.

Referring to FIG. 3, there is again shown a substrate 11 having a gate 13 thereon as well as additional topography 15 and 17 and a photoresist 19 just as in FIG. 1. In FIG. 3, however, there is a mask 37 in accordance with the present invention, including an opaque area 39, comparable to the opaque area 27 of the mask 21 shown in FIG. 1. Immediately surrounding the opaque area 39 is a border 41 which is, nominally, fully transparent to the radiation to be projected. The remainder of the mask 37, however, includes a partially opaque (semi-transparent) area 43 which serves to reduce the intensity of the light passing toward the resist 19. As the light, shown by the arrows 45, passes through the semi-transparent portions 43 of the mask 37, its intensity is reduced as shown by the arrows 47.

In use, the completed mask is used to reduce light scatter (particularly the scattering producing reflective notching effects) while lithographically forming a resist feature on a microcircuit substrate having an uneven topography. As in the usual lithography, a resist layer is placed on the substrate with its overlying topography and a source of light or the other radiation is provided through a mask. By use of the mask as described above, with a positive resist, the opaque area of the mask blocks out the transmission of the radiation directed toward the resist feature. The fully transparent narrow border portion of the mask permits maximum transmission of the radiation and defines the resist feature. The partially transmissive portion of the mask permits only an attenuated dosage of radiation to the area outside the narrow border. The attenuated dosage is approximately seventy-five percent (75%) of the dosage directed to the narrow border area.

Because of the reduced light projected onto the resist, the reflected light, as shown by the arrows 49, is likewise reduced such that it has little or no effect on the resist in the shadow of the opaque portion 39. Consequently, the resulting resist element has sidewalls conforming much more to the sidewalls 33 as shown in FIG. 2 thereby providing a much more precise element configuration.

Preparation of masks having partially opaque areas is, in itself, well known. Such methods include application of a light absorptive film, such as chromium, of a specific thickness to permit the desired transmittance; as well as application of a thick opaque layer of such a film followed by the subsequent removal of a sufficient amount thereof to obtain the desired transmittance. One such method is described in an article entitled Overcoming of Global Topography and Improvement of Transmittance Controlled Mask (TCM) by Woo-Sung Han, et al; Proceedings of SPIE (The Society of Photo-Optical Instrumentation Engineers), Volume 2197, pp 140–149, Mar. 2–4, 1994. In TCM, thicker resist areas are exposed to more light than thin resist areas. The radiation to the thinner resist areas is attenuated by an absorptive film on the mask.

Figure 4A:
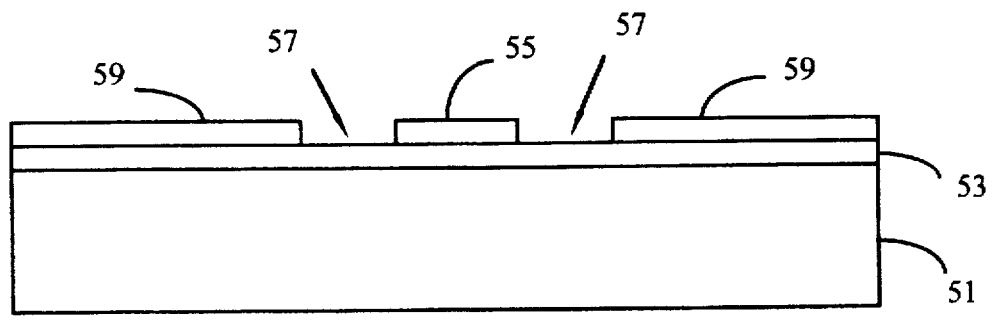
FIGS. 4a through 4d are schematic elevational cross sectional views showing the principle steps in one method of fabricating three tone masks in accordance with the invention.

Referring to FIGS. 4a through 4d, there is shown a preferred method of making the mask 37 in accordance with the invention. In FIG. 4a there is shown a plate of glass 51 upon which has been deposited a layer of chromium 53 having a sufficient thickness to be opaque to the intended radiation. A photoresist is then deposited on the chromium 53 in a pattern defining the desired elements as at 55. In addition, the photoresist pattern covers the remaining surface of the chromium except for a narrow border 57 of about 0.2 μm around the elements 55. Thus major portions of the chromium film is covered by photoresist as shown at 59. The narrow border 57 is preferably at least 0.05 μm wide and less than 0.3 μm wide, and most preferably approximately 0.2 μm (±25%) wide.

Figure 4B:
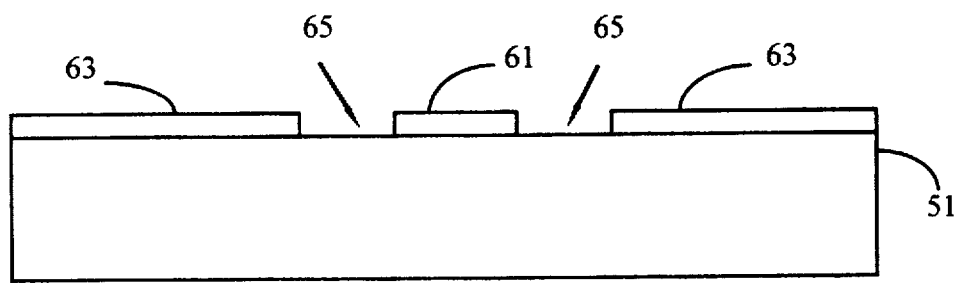

The chromium is then etched away in the areas 57 and the photoresist 55 and 59 is removed to produce the transitory configuration shown in FIG. 4b wherein the chromium portion 61 forms what will be the opaque area of the mask defining the resist element; the areas 63 define what will become the areas of partial opacity. The openings 65 in the chromium define the area of the transparent border about the resist element.

Figure 4C:
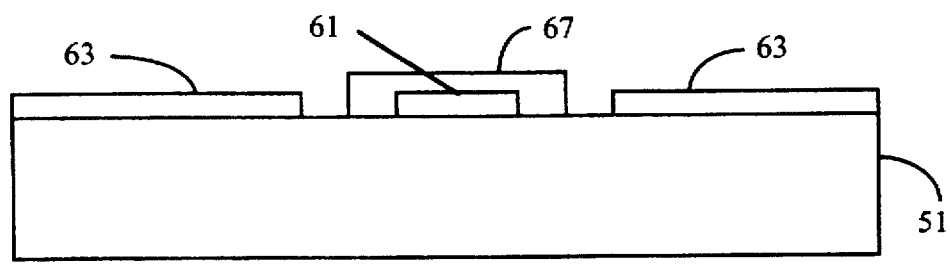
Figure 4D:
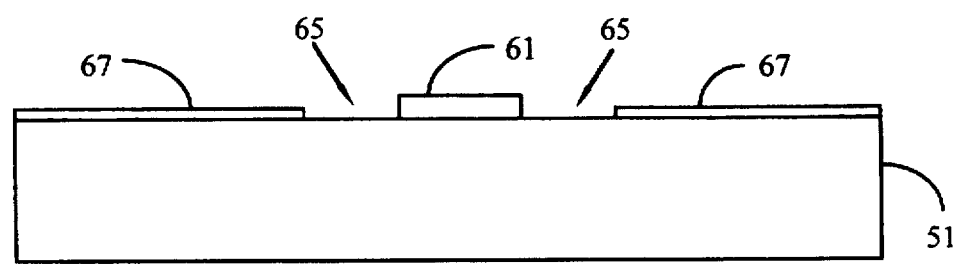

A second resist 67 is then applied over the chromium portion 61 while leaving the portions 63 fully exposed as shown in FIG. 4c. The portions of chromium are then partially etched to the thickness required for the desired opacity, for instance, twenty-five percent (25%) in the present example. After the desired portion of the chromium is removed, the mask is completed as shown in FIG. 4d. The mask shown in FIG. 4d includes the glass 51 having a completely opaque portion 61 in the form of the desired element as defined by the thick layer of chromium 57; a completely transparent border 65 around the chromium 61 and a partially opaque portion 67 beyond the boarder area 65.

Figure 5A:
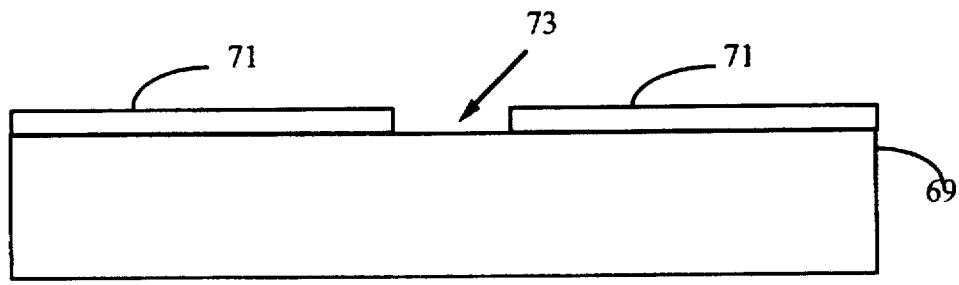
FIGS. 5a through 5d are schematic elevational cross sectional views showing the principle steps in another method of fabricating three tone masks in accordance with the invention.
Figure 5B:
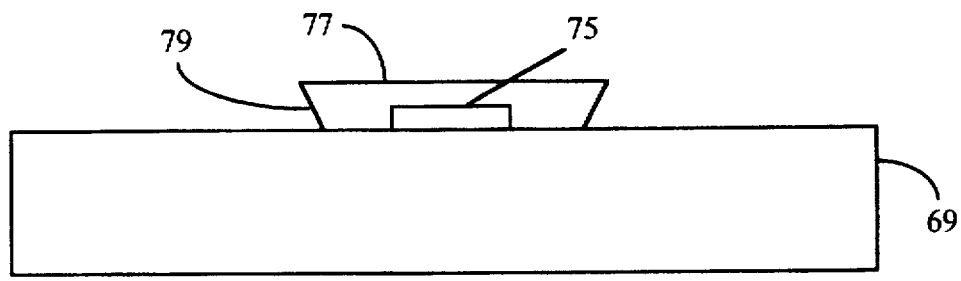

Referring to FIG. 5a through 5d, there is shown another method, called the "lift off" process, for making the mask 37 in accordance with the invention. In FIG. 5a there is shown a plate of glass 69 upon which has been positioned a pattern of photoresist 71 to include an opening 73 to the glass in the form of a desired feature. A layer of chromium, having a sufficient thickness to be opaque to the intended radiation, is then deposited over the resist and the glass. The resist is then removed in the usual manner leaving the chromium 75 on the glass 69 as shown in FIG. 5b. The chromium 75 is in the shape of the desired element. A second resist 77 is then applied over and beyond the chromium 75 by a distance of about 0.2 μm. A second resist 77 is formed with inwardly sloping side edges 79. One manner of forming the sloped side edges is to use a negative resist with a substantial amount of dye so that relatively little of the exposure light penetrates to the bottom of the resist.

Figure 5C:
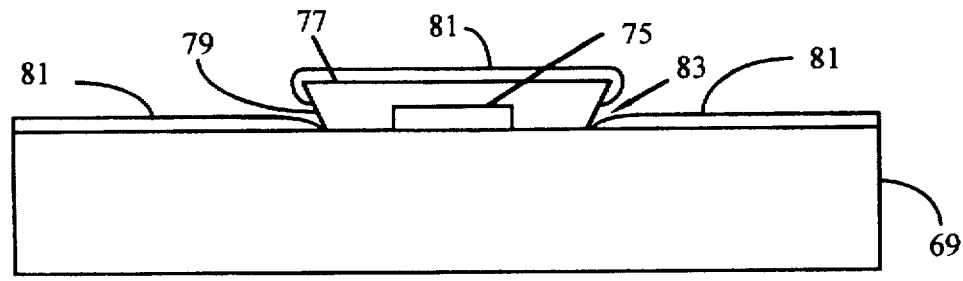

A second layer of chromium 81 is then deposited, such as by sputtering, over the glass 69 and the resist 77 as shown in FIG. 5c. This additional chromium is deposited at a thickness considerably less than required to be opaque to the intended radiation, but of sufficient thickness to provide some opacity, for instance, twenty-five percent (25%) in the present example. Because of the inwardly sloped side edges 79, the chromium layer 81 is discontinuous, leaving gaps 83 on the side edges 79 themselves.

Figure 5D:
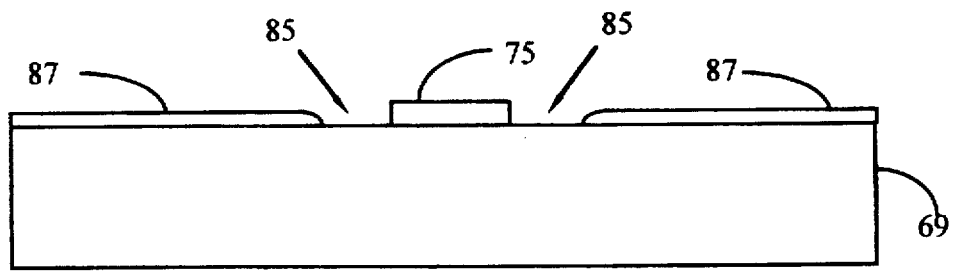

The resist 77 is then removed. As the resist 77 is removed, it lifts that portion of the chromium 81 deposited over it so that the mask is completed as shown in FIG. 5d. The mask shown in FIG. 5d, like the mask shown in FIG. 4d, includes the glass 69 having a completely opaque portion in the form of the desired element as defined by the thick layer of chromium 75; a completely transparent border 85 around the chromium 75 and a partially opaque portion 87 beyond the boarder area 85. The opacity of the open mask areas is preferably between ten and forty percent (10% to 40%), and most preferably approximately twenty five percent (20%) plus or minus ten percentage points (i.e. 10% to 30%)

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For instance, the embodiments described have been directed to processes using a positive photoresist but it should be understood that the invention also has applicability when negative photoresists are employed.

We claim:

1. A method of reducing light scatter while lithographically producing a resist feature on a microcircuit substrate having an uneven topography comprising:
   a) providing a resist layer on the substrate and topography;
   b) providing a source of radiation;
   c) blocking the transmission of said radiation to that portion of the resist layer defining the resist feature;
   d) directing said radiation to a narrow border area around said resist feature in sufficient dosage to define said resist feature; and
   e) directing an attenuated dosage of said radiation to areas outside said border area.

2. A method of reducing light scatter while lithographically producing a resist feature on a microcircuit substrate having an uneven topography as defined in claim 1 wherein the step of directing an attenuated dosage of said radiation to areas outside said border area comprises providing a dosage of approximately seventy five percent of the dosage directed to said narrow border area.

3. A method of reducing light scatter while lithographically producing a resist feature on a microcircuit substrate having an uneven topography as defined in claim 1 wherein said narrow border area is approximately 0.2 µm in width.

4. A method of reducing light scatter while lithographically producing a resist feature on a microcircuit substrate having an uneven topography as defined in claim 1 wherein the step of directing an attenuated dosage of said radiation to areas outside said border area comprises providing a mask between said source of radiation and said resist layer; said mask having partial opacity in areas corresponding to said areas outside said border area.

5. A method of reducing light scatter while lithographically producing a resist feature on a microcircuit substrate having an uneven topography as defined in claim 4 wherein the partial opacity of said mask is approximately twenty five percent.

6. A method of reducing light scatter while lithographically producing a resist feature on a microcircuit substrate having an uneven topography comprising:
   a) providing a resist layer on the substrate and topography;
   b) providing a source of radiation;
   c) blocking the transmission of said radiation to a first portion of said resist layer;
   d) directing an attenuated dosage of said radiation to a second portion of said resist layer; and
   e) directing a full dosage of said radiation to a narrow border area between said first and second portions of said resist layer.

* * * * *